United States Patent [19]

Lockwood et al.

[11] Patent Number: 4,697,143
[45] Date of Patent: Sep. 29, 1987

[54] WAFER PROBE

[75] Inventors: Larry R. Lockwood, McMinnville; Kimberly R. Gleason; Eric W. Strid, both of Portland, all of Oreg.

[73] Assignee: Cascade Microtech, Inc., Beaverton, Oreg.

[21] Appl. No.: 605,462

[22] Filed: Apr. 30, 1984

[51] Int. Cl.[4] .................... G01R 31/00; H01P 3/08
[52] U.S. Cl. ................... 324/158 P; 324/158 F; 324/73 PC; 333/246
[58] Field of Search .............. 324/158 P, 158 F, 95; 333/158, 221, 12, 238, 246, 81 A, 22 R, 21 R; 174/35 MS, 35 GC; 339/108 TP, 117

[56] References Cited

U.S. PATENT DOCUMENTS

| | | | |
|---|---|---|---|
| 3,596,228 | 7/1971 | Reed, Jr. | 324/158 P |
| 3,654,573 | 4/1972 | Graham | 333/238 |
| 4,186,338 | 1/1980 | Fichtenbaum | 324/73 PC |
| 4,371,742 | 2/1983 | Manly | 174/35 MS |

FOREIGN PATENT DOCUMENTS

| | | | |
|---|---|---|---|
| 0019046 | 2/1977 | Japan | 333/81 A |
| 0130602 | 8/1983 | Japan | 333/81 A |

OTHER PUBLICATIONS

Edward E. Alan, "Electromagnetic Radiation Meter"; IEEE Transactions on Microwave Theory and Techniques; vol. MTT-19, No. 2; Feb. 1971; pp. 249–250.

Primary Examiner—Reinhard J. Eisenzopf
Assistant Examiner—Vinh P. Nguyen
Attorney, Agent, or Firm—Dellett, Smith-Hill & Bedell

[57] ABSTRACT

A wafer probe is provided having metallic transmission lines mounted on a tapered alumina substrate generally surrounded by microwave absorbing material. The probe provides for on-wafer measurements of small planar devices at frequencies from DC to at least 18 GHz with low inductance, and with constant characteristic impedance from the probe external cable terminal to the point of contact on device being probed. The microwave absorbing material absorbs energy propagating along the probe ground preventing this energy from resonating, radiating and re-exciting normal transmission line modes with minimal transmission line mode resonance along the probe ground. The probe, which may be coupled to receive signals from a coaxial cable, is capable of making contact with bonding pads of a device having a center-to-center distance between pads of only 4 mils.

28 Claims, 8 Drawing Figures

WAFER PROBE

BACKGROUND OF THE INVENTION

The present invention relates to integrated circuits (IC) measurement generally, and particularly to wafer type probes for measurement of electrical characteristics of small planar devices (IC elements) fabricated on semiconductive or dielectric wafers.

Wafer probes provide temporary electrical contacts between test equipment and the very small terminal points (bonding pads) of IC elements on semiconductive wafers. Use of wafer probes permits operation and testing of IC elements prior to separating, bonding and packaging the individual IC elements on the wafer.

A major problem with most existing wafer probes is their inability to permit accurate measurements of the electrical characteristics of the devices when contacting low impedances at high frequencies (e.g., when signal frequencies above approximately 2 GHz are applied). These inaccuracies arise from high frequency characteristics of the probes themselves. At high frequencies, excessive probe inductance or changing probe radiation impedance can greatly reduce the accuracy of the tests made. Although the use of computercorrected measurements may reduce the adverse effect of excess inductance to some extent, the radiation is generally not repeatable and, therefore, not correctable.

These inaccuracies were significantly reduced by the improved wafer probe described and claimed in prior application, Ser. No. 318,084 filed Nov. 4, 1981. The present invention is a further improvement in wafer probe technology alleviating another source of non-repeatable measurement innacuracy which becomes more apparent when inaccuracies due to exccessive probe inductance and changing probe radiation impedance are otherwise reduced.

This additional source of measurement inaccuracy arises in existing wafer probes when some of the energy transmitted or reflected from the device under test excites the transmission line mode resulting from the shield or ground of the probe transmission line acting as one conductor, and the wafer stage, wafer or other nearby conductors acting as the other conductor. This "outer conductor" mode energy typically propagates up the probe board, reflects off the probe mounting block or other discontinuities, and then propagates back down the board. Upon reaching the device under test, some of the "outer conductor" mode energy can couple back into the normal modes, while the remainder is dissipated in the device under test, and/or reflected back up the probe. Thus a resonator results from the energy alternately reflecting from the device under test and from the probe mounting area. While the "outer conductor" mode resonates on the probe board, some of its energy is also radiated.

This radiation from the "outer conductor" mode resonance is particularly undesirable since the radiated energy reflects back from the conductors in the vicinity of the wafer stage and these conductors typically move in relation to the wafer, creating non-reproducible measurements.

What is needed and would be useful, therefore, is a low excess inductance wafer probe capable of making accurate on-wafer measurements by minimizing errors due to excessive probe inductance and changing probe radiation impedance and by minimizing radiation due to transmission line mode resonance along the probe ground.

SUMMARY OF THE INVENTION

In accordance with the present invention a wafer probe is described incorporating microwave absorbing material positioned to attentuate microwave energy propagating along the ground plane of the wafer probe. The addition of this microwave absorbing material significantly reduces transmission line mode resonance along in the probe ground conductors and thereby reduces the resultant radiation.

In a particular embodiment of the present invention, microwave absorbing material is provided in combination with a wafer probe of the type generally disclosed in the aforementioned prior application, Ser. No. 318,048. The improved probe comprises a transmission line assembly and a coaxial cable connector installed on a mounting block and layers of absorber material generally surrounding the transmission line assembly. The transmission line assembly, comprising ground and signal conductors deposited on a tapered alumina substrate, conducts signals between the bonding pads of the device under test and the connector from which a coaxial cable may carry signals between the probe and test equipment. The sizing and arrangement of the ground and signal conductors of the transmission line are adjusted to match the characteristics impedance of the coaxial cable. This arrangement extends the (e.g., 50 ohm) environment of the coaxial cable to the bonding pads of the device under test, thus significantly reducing errors resulting from excessive probe impedance at high test frequencies, from impedance mismatching, and from changing probe radiation impedance.

The microwave absorbing material, which generally surrounds the transmission line assembly, and which may be in contact with the probe ground, is provided to absorb energy propagating up the ground plane of the probe, thereby keeping this energy from resonating, radiating or re-exciting the normal transmission line mode.

Thus, the microwave wafer probe of the present invention allows accurate on-wafer measurements of very small planar devices such as transistors, inductors, capacitors, resistors, IC's, SAW filters and other such devices at frequencies from DC to 18 GHz. By connecting a network analyzer to the probe and calibrating the system using impedance standards much smaller than a wavelength, chip measurements of substantial accuracy can be attained. The improved accuracy is due to the elimination of irreproducible parasitics of fixturing, packaging and bond wires, and to the elimination or substantial reduction of radiation due to transmission line mode resonance along the probe ground.

The probe of the present invention permits quick simultaneous measurements at one or more bonding pads on a chip, without dicing, mounting and bonding the devices. The probe also allows selection of die from RF performance before being bonded and allows automated trimming of microwave characteristics of integrated circuit devices in the wafer state.

It is accordingly an object of the present invention to provide an improved apparatus for providing temporary electrical contact between test equipment and the bonding pads of small planar devices fabricated on semiconductive wafers, the improved apparatus being capable of permitting accurate measurement of the high frequency electrical characteristics of the devices through reduction of adverse effects due to excessive or changing probe impedance, to impedance mismatching, and to transmission line mode resonance along the probe ground.

The subject matter which we regard as our invention is particularly pointed out and distinctly claimed in the concluding portion of this specification. The invention, however, both as to organization and method of operation, together with further advantages and objects thereof, may best be understood by reference to the following description taken in conjunction with the accompanying drawings wherein like reference characters refer to like elements.

DESCRIPTION OF THE PREFERRED EMBODIMENT

Figure 1:
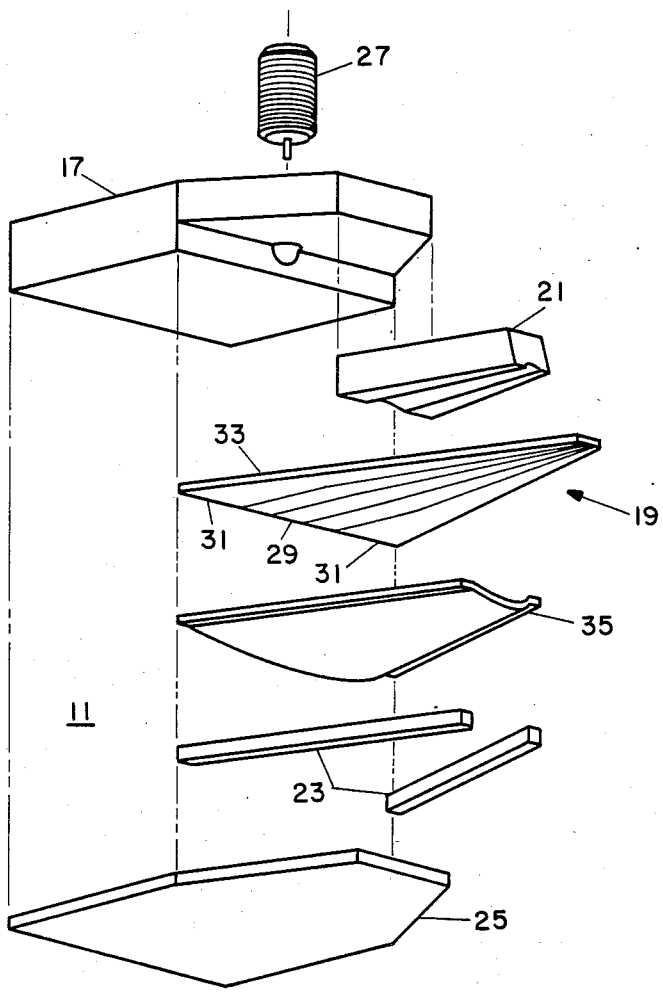
FIG. 1 is an exploded perspective view of the wafer probe of the present invention.
Figure 3:
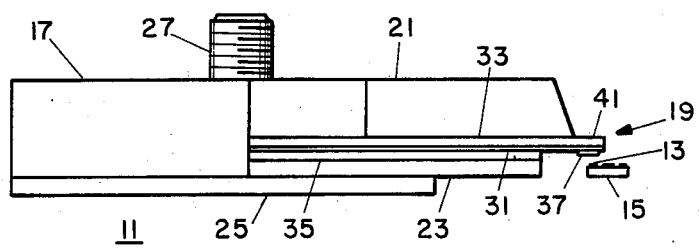
FIG. 3 is a side view of the wafer probe of FIG. 2.
Figure 2:
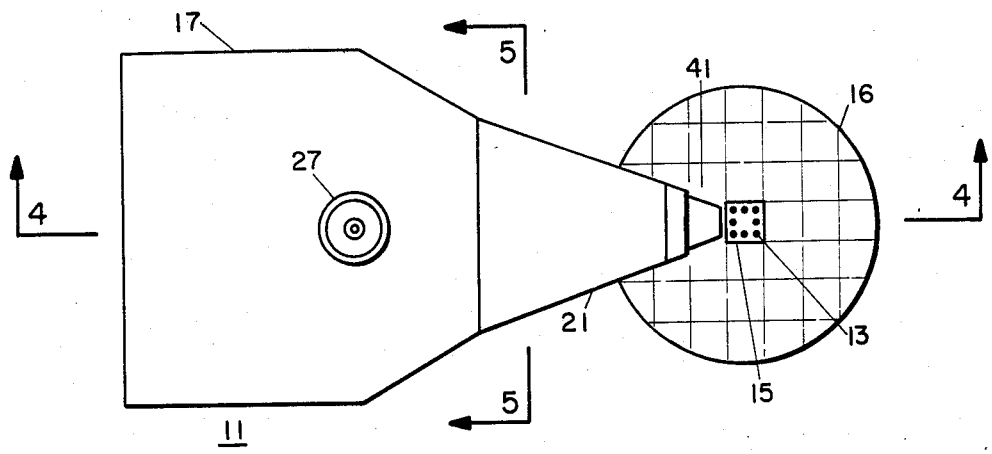
FIG. 2 is a plane view of the wafer probe in relation to a wafer element to be tested.

Referring now to FIG. 1, there is shown a wafer probe 11 of the present invention. The probe comprises probe mounting block 17, transmission line assembly 19, metal channel 35, upper absorber layer 21, intermediate absorber layers 23, lower absorber layer 25 and connector 27. In FIGS. 2 and 3, probe 11 is shown in its intended use engaging minutely spaced bonding pads 13 of a planar device 15 on wafer 16 for testing selected circuit components of planar device 15.

Figure 6:
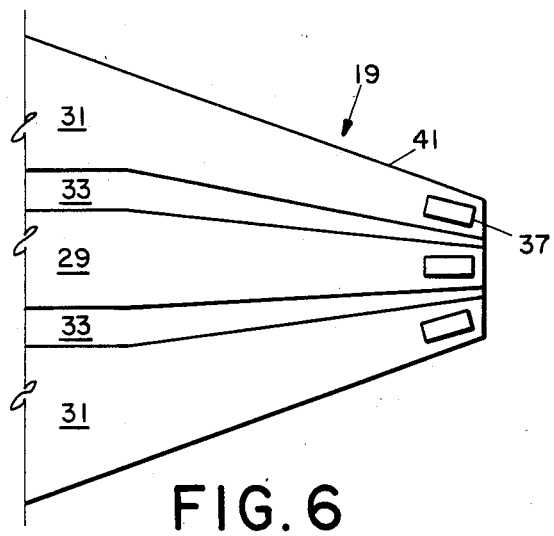
FIG. 6 is a bottom view of the tip of the probe board of the wafer probe of FIG. 2 showing a coplanar transmission line arrangement of the ground and signal conductors.

As shown in FIG. 1, transmission line assembly 19 comprises a signal conductor 29 and ground conductors 31 mounted on tapered probe board 33, made of a dielectric material such as alumina ($Al_2O_3$) approximately 10 mils thick. Signal conductor 29 and ground conductors 31 are strips of conducting material such as gold deposited on the alumina substrate of probe board 33. As seen in FIG. 6, conductors 29 and 31 converge toward probe board tip 41 to align above the bonding pads of the device being tested. Contact with the device bonding pads is made through, for example, small gold contact pads 37 mounted at the ends of signal conductor 29 and ground conductors 31.

As seen in FIG. 6, signal conductor 29 width and distance from ground conductors 31 is held constant up to a short distance from probe board tip 41. Then signal conductor 29 and ground conductors 31 are tapered down, for example, from a 10-mil width to a 1-mil width at probe board tip 41. The gaps between the signal conductor 29 and ground conductors 31 are correspondingly tapered near probe board tip 41 such that the transmission line formed by signal conductor 29 and ground conductors 31 is of a constant characteristic impedance (e.g., fifty ohm) through the length of transmission line assembly 19 to the points of contact with the bonding pads (e.g., pads having a surface area of approximately 2 mils square, of similar width to conductors 29 and 31 at probe board tip 41, and center spaced approximately 4 mils apart) of the device being probed.

Figure 4:
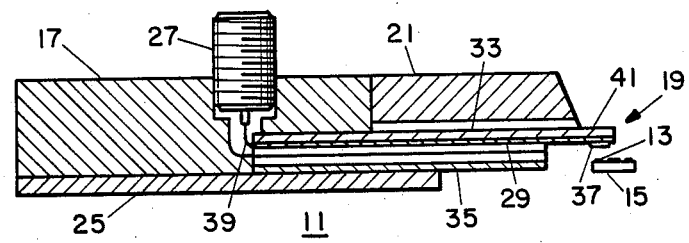
FIG. 4 is a sectional view (4—4) of the wafer probe of FIG. 2.
Figure 5:
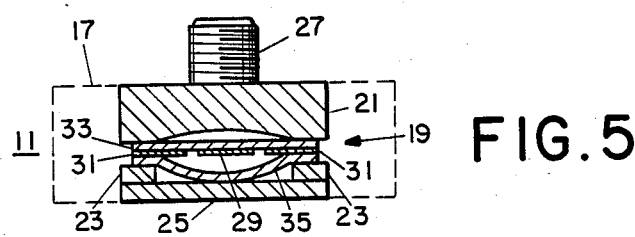
FIG. 5 is sectional view (5—5) of the wafer probe of FIG. 2.

As shown in FIG. 1, transmission line assembly 19 is generally surrounded by absorber layers 21, 23 and 25. These absorber layers are made of a microwave absorbing material having a relative characteristic impedance close to that of free space ($|z|/|z_o| = 0.5$ to $0.7$) but with a high magnetic loss coefficient. Material of this characteristic impedance will not reflect microwave energy or produce dielectric transmission line modes. Typical examples of suitable absorber material are iron or ferrite-containing Emerson & Cuming, Inc. "Eccosorb" brand models GDS, MF-S, MF, and CR-S. As shown in FIG. 5, upper absorber layer 21, grooved to provide spatial separation of the absorber from signal conductor 29, is mounted on the upper side of probe board 33. Intermediate and lower absorber layers 23 and 25 are mounted below probe board 33 in contact with metal channel 35. Metal channel 35, contacting ground conductors 31 and spanning signal conductor 29, maintains absorber spacing around signal conductor 29, improves structural integrity of transmission line assembly 19, electrically bonds opposing ground conductors 31, and provides shielding for signal conductor 29. Transmission line assembly 19 and connector 27 are attached to mounting block 17 as best shown in FIG. 4. In the preferred embodiment, mounting block 17 is also of a microwave absorbing material with characteristics similar to that of the absorber layers. Signal conductor 29 is terminated on connector 27 by conducting tab 39. Conductor 27 provides means for connecting an external cable (e.g., a fifty ohm coaxial cable, not shown) to wafer probe 11 for carrying signals to external test equipment.

Figure 7:
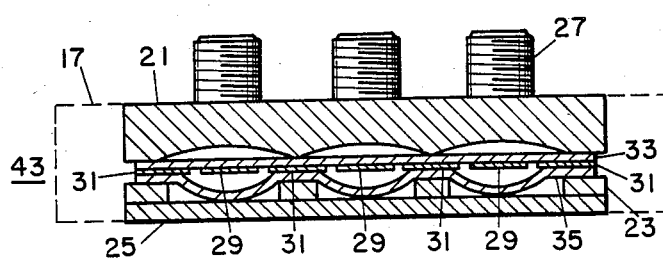
FIG. 7 is a sectional view of an alternate embodiment of the present invention wherein the wafer probe is adapted to simultaneously probe a plurality of signal points on a single wafer.
Figure 8:
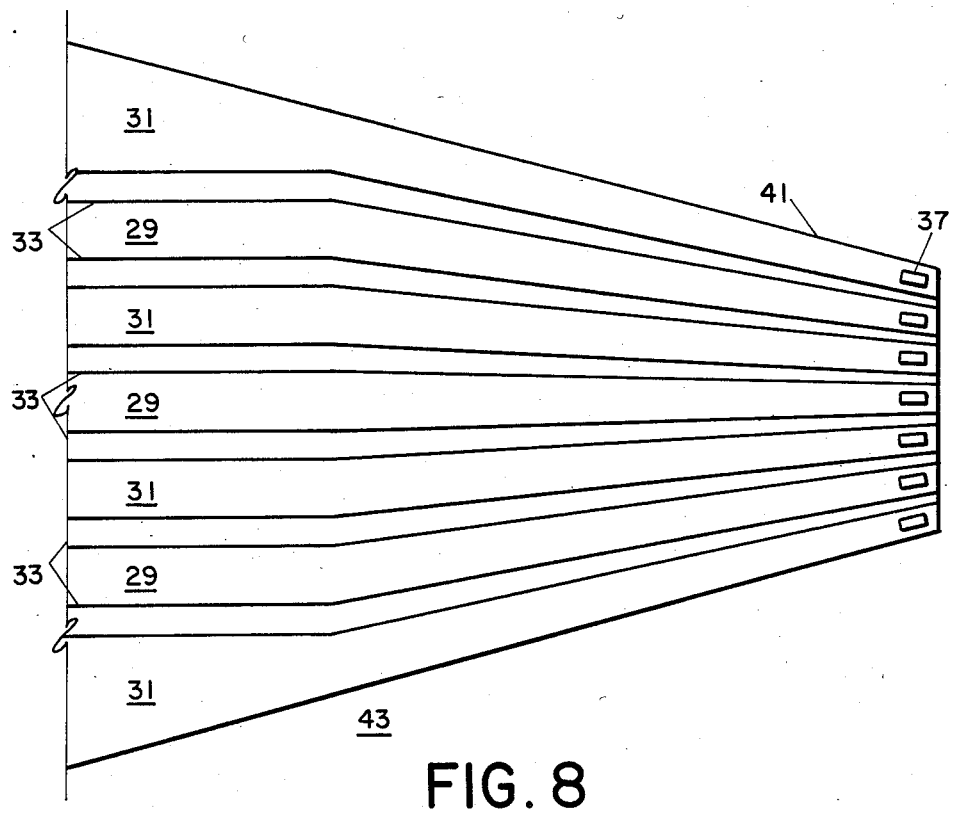
FIG. 8 is a bottom view of the probe board of the wafer probe in FIG. 7 showing a plurality of coplanar transmission line conductors.

The geometry of the wafer probe can be modified to correspond to the geometry of the device to be measured by the probe. While a probe having only a single signal conductor has been discussed, a similar probe may be constructed having a plurality of signal and ground conductors capable of simultaneously probing a plurality of planar device bonding pads. For example, FIGS. 7 and 8 show an alternative embodiment of the present invention, multi-signal wafer probe 43, wherein a plurality of signal conductors 29 and the ground plane probe conductors 31 are combined in a single trapezoidal-shaped wafer probe board 33. FIG. 7 is a sectional view (analagous to FIG. 5) of multi-signal wafer probe 43 showing upper, intermediate and lower absorber layers 21, 23 and 25, respectively, generally surrounding probe board 33. Metal channel 35 connects all ground conductors 29 while spanning all signal conductors 29. Connectors 27 provide external cable access to each signal conductor 29. FIG. 8 depicts tip 41 of the underside of probe board 33 for the multi-signal wafer probe 43. On the narrow end of probe board 33 conductors 29 and 31 taper to align above the device bonding pads (e.g. 4-mil on center). In FIG. 7, signal conductors 29 are spaced (e.g. 400-mil on center) at the wide end of probe board 33 to align below cable connectors 27 mounted on mounting block 17. As in the case of the single signal conductor probe, signal and ground conductor width and spacing in the multi-signal wafer probe are selected to maintain constant transmission line characteristic impedance throughout the length of probe board 33.

While in the preferred embodiments transmission line assembly 19 is shown in FIG. 5 as generally surrounded by absorber material, it is noted that upper absorber layer 21, in the absence of intermediate absorber layers 23 and lower absorber layer 25, alone provides most of the reduction in undesireable transmission line mode resonance in the ground plane of the transmission line assembly providing significant attenuation of microwave radiation from the probe. The addition of intermediate and lower absorber layers 23 and 25 provides a more modest improvement in probe performance. Thus, in an alternative embodiment of the present invention, intermediate absorber layers 23 and lower absorber layer 25 may be omitted with some, but not a major, loss of probe accuracy. The absorber layers are taperd to produce a gradual absorbtion of a wave propagating up probe ground conductors allowing little reflection. While the absorber material surrounding the transmission line assembly is shown constructed of four distinct layers, alternative embodiments may incorporate other absorber material arrangements.

Although the embodiments discussed illustrate probes employing transmission lines having a coplanar waveguide arrangement, it is understood that performance of other probes incorporating coaxial, non-coplanar metallic strip or other transmission line arrangements may be improved by installation of suitable microwave absorbing material in appropriate locations about the probe.

While we have shown and described several preferred embodiments of our invention, it will be apparent to those skilled in the art that many other changes and modifications may be made without departing from our invention in its broader aspects. We therefore intend the appended claims to cover all such changes and modifications as fall within the true spirit and scope of our invention.

What we claim as our invention is:

1. A probe for connecting electrical test equipment to selected points on a small planar device on a semiconductive wafer, comprising:
    a transmission line assembly, having a probe board and having a metallic signal conductor and a metallic ground conductor spaced from said metallic signal conductor on the probe board; and
    selected microwave absorbing material positioned near the transmission line ground conductor on said probe board, said absorbing material having a thickness at least as great as the spacing between said signal conductor and ground conductor.

2. A probe as in claim 1 wherein the selected microwave absorbing material has a high magnetic loss coefficient and a characteristic impedance near that of free space.

3. A probe as in claim 1 wherein the probe board comprises a dielectric material.

4. A probe as in claim 1 wherein the probe board comprises alumina ($Al_2O_3$).

5. A probe as in claim 1 wherein the selected microwave absorbing material comprises ferrite.

6. A probe as in claim 1 wherein the selected microwave absorbing material comprises iron.

7. A probe as in claim 1 wherein the selected microwave absorbing material generally surrounds the transmission line.

8. A probe for connecting electrical test equipment to selected points on a small planar device on a semiconductive wafer, comprising:
    a transmission line assembly, having a probe board and having a metallic signal conductor and a metallic ground conductor deposited in a coplanar fashion in one side of the probe board; and
    selected microwave absorbing material positioned near the transmission line ground conductor for substantially absorbing extraneous external transmission line modes, said absorbing material comprising a body of material having a high magnetic loss coefficient and positioned near and substantially coplanar with said probe board.

9. A probe for connecting electrical test equipment to selected points on a small planar device on a semiconductive wafer, comprising:
    a transmission line assembly having a probe board, with a top and a bottom side, and having a metallic signal conductor and a metallic ground conductor deposited in a coplanar fashion on the bottom side of the probe board; and
    selected microwave absorbing material positioned near the top side of the probe board.

10. A probe for connecting electrical test equipment to selected points on a small planar device on a semiconductive wafer, comprising:
    a transmission line assembly having a probe board and having a metallic signal conductor and a metallic ground conductor deposited in a coplanar fashion on the probe board; and
    a body of selected microwave absorbing material having substantial thickness adjacent the transmission line assembly;
    said body of selected microwave absorbing material being tapered from a wider dimension to a narrower dimension proximate said small planar device.

11. A probe for connecting electrical test equipment to selected points on a small planar device on a semiconductive wafer, comprising:
    a transmission line assembly having a probe board, at least one metallic signal conductor and one more than an equal number of metallic ground conductors, the signal and ground conductors being deposited alternately in a coplanar fashion on one side of the probe board;
    a metallic channel attached to the ground conductors and spanning, but not touching, the at least one signal conductor; and
    selected microwave absorbing material generally surrounding the transmission line assembly.

12. A probe for connecting electrical test equipment to selected points on a small planar device on a semiconductive wafer, comprising:
    a probe board,
    a plurality of transmission lines mounted on the probe board, and
    selected microwave absorbing material positioned near the transmission lines for substantially absorbing extraneous external transmission line modes, said absorbing material comprising a body of material having a high magnetic loss coefficient and mounted substantially on and substantially coplanar with said probe board.

13. A probe for connecting electrical test equipment to selected points on a small planar device on a semiconductor wafer, comprising:
a transmission line assembly, having a probe board, and having a metallic signal conductor and a metallic ground conductor deposited on the probe board; wherein the metallic ground and signal conductors form a transmission line extending from the selected points on the planar device to points of connection with the electrical test equipment, the ground and signal conductors being sized and juxtaposed such that the transmission line has a constant characteristic impedance throughout its length; and
selected microwave absorbing material positioned near the transmission line ground conductor.

14. A probe for connecting electrical test equipment to selected points on a small planar device on a semiconductive wafer, comprising:
a transmission line assembly having a probe board, with a top and a bottom side, and having a metallic signal conductor and a metallic ground conductor deposited in a coplanar fashion on the bottom side of the probe board; and
selected microwave absorbing material positioned above and near the top side of the probe board,
wherein the probe board is trapezoidal-shaped and the microwave absorbing material comprises a tapered layer mounted on, and generally coextensive with, the top of the probe board.

15. A probe as in claim 14 wherein the microwave absorbing material layer has a groove extending along the top of the probe board above the signal conductor, the groove being wider than the signal conductor.

16. A probe for connecting electrical test equipment to selected points on a small planar device on a semiconductive wafer, comprising:
a transmission line assembly having a probe board, at least one metallic signal conductor and one more than an equal number of metallic ground conductors, the signal and ground conductors being deposited alternately in a coplanar fashion on one side of the probe board;
a metallic channel attached to the ground conductors and spanning, but not touching, the at least one signal conductor; and
selected microwave absorbing material generally surrounding the transmission line assembly, wherein the microwave absorbing material comprises iron.

17. A probe for connecting electrical test equipment to selected points on a small planar device on a semiconductive wafer, comprising:
a transmission line assembly having a probe board, at least one metallic signal conductor and one more than an equal number of metallic ground conductors, the signal and ground conductors being deposited alternately in a coplanar fashion on one side of the probe board;
a metallic channel attached to the ground conductors and scanning, but not touching, the at least one signal conductor; and
selected microwave absorbing material generally surrounding the transmission line assembly, wherein the microwave absorbing material comprises ferrite.

18. A probe for connecting electrical test equipment to selected points on a small planar device on a semiconductive wafer, comprising:
a transmission line assembly having a probe board, at least one metallic signal conductor and one more than an equal nmber of metallic ground conductors, the signal and ground conductors being deposited alternately in a coplanar fashion on one side of the probe board;
a metallic channel attached to the ground conductors and spanning, but not touching, the at least one signal conductor; and
selected microwave absorbing material generally surrounding the transmission line assembly;
wherein the probe board is trapezoidal-shaped and the microwave aborbing material tapers with the probe board.

19. A probe for connecting electrical test equipment to selected points on a small electrical component, said probe comprising:
a transmission line assembly having a probe board and having a metallic signal conductor and a metallic ground conductor spaced on the probe board; and
selected microwave absorbing material positioned near the transmission line ground conductor;
wherein the probe board is trapezoidal-shaped and the microwave absorbing material comprises a tapered layer mounted on, and generally coextensive with, the probe board.

20. A probe for testing an electrical component by means of connecting electrical test equipment to selected points on said electrical component, said probe comprising:
a transmission line assembly having a probe board formed of dielectric material and having a metallic signal conductor and a metallic ground conductor deposited on said board to form a transmission line, said transmission line extending on said board substantially between selected points on said electrical component with which said probe is used to make contact and points of connection with said external test equipment, the ground and signal conductors being sized and spaced such that said transmission line has a substantially constant characteristic impedance,
said probe further including a body of microwave absorbing material positioned adjacent said transmission line between said electrical component and said points of connection with said external test equipment for substantially completely absorbing microwave energy propagating up the board from said electrical component toward said points of connection in a transmission line mode involving at least one of said probe conductors and other conductors in the environment whereby to prevent undesired resonance, emission and non-reproducibility of measurements.

21. The probe according to claim 20 wherein said probe board and said body of microwave absorbing material are substantially planar.

22. The probe according to claim 20 wherein said probe includes connecting tabs proximate said electrical component and joined to said metallic conductors for making contact with said selected points on said electrical component.

23. The probe according to claim 20 wherein said deposited conducors form a coplanar transmission line.

24. The probe according to claim 20 wherein said probe board, said deposited conductors, and said body of microwave absorbing material taper from wider proportions near said points of connection with external test equipment to narrower proportions nearer said selected points on said electrical component.

25. The probe according to claim 20 wherein said microwave absorbing material has a high magnetic loss coefficient and a characteristic impedance near that of free space.

26. The probe according to claim 20 wherein the total thickness of said body of microwave absorbing material on said board is at least as great as the spacing between said metallic conductors forming said transmission line.

27. The probe according to claim 26 wherein said total thickness is greater than said spacing between said metallic conductors forming said transmission line.

28. A probe for connecting electrical test equipment to selected points on a small planar device on a semiconductive wafer, comprising:
a transmission line assembly, having a probe board and having a metallic signal conductor and a metallic ground conductor spaced on the probe board; and
selected microwave absorbing material positioned near the transmission line ground conductor on said probe board, said absorbing material having a thickness at least as great as the spacing between said signal conductor and ground conductor, wherein the probe board is trapezoidal-shaped and the microwave absorbing material comprises a tapered layer mounted on, and generally coextensive with, the top of the probe board.

* * * * *

UNITED STATES PATENT AND TRADEMARK OFFICE
CERTIFICATE OF CORRECTION

PATENT NO. : 4,697,143

DATED : September 29, 1987

INVENTOR(S) : Larry R. Lockwood, Kimberly R. Gleason and Eric W. Strid

It is certified that error appears in the above-identified patent and that said Letters Patent is hereby corrected as shown below:

Column 1, line 26, "computercorrected" should be --computer-corrected--.

Column 2, line 28, "characteristics" should be --characteristic--.

Column 6, line 10, "in" should be --on--.

Column 7, line 63, "scanning" should be --spanning--.

Column 8, line 6, "nmber" should be --number--.

Column 8, line 68, "conducors" should be --conductors--.

Signed and Sealed this

Twenty-fifth Day of October, 1988

Attest:

DONALD J. QUIGG

*Attesting Officer*  *Commissioner of Patents and Trademarks*